(12) United States Patent
Ye

(10) Patent No.: US 9,496,828 B2
(45) Date of Patent: Nov. 15, 2016

(54) SYSTEM AND METHOD FOR ENVELOPE TRACKING POWER SUPPLY

(75) Inventor: Zhong Ye, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 406 days.

(21) Appl. No.: 13/188,948

(22) Filed: Jul. 22, 2011

(65) Prior Publication Data

US 2013/0021827 A1 Jan. 24, 2013

(51) Int. Cl.
| | |
|---|---|
| H02M 3/335 | (2006.01) |
| H03F 1/02 | (2006.01) |
| H03F 1/32 | (2006.01) |
| H03F 3/189 | (2006.01) |
| H03F 3/24 | (2006.01) |

(52) U.S. Cl.
CPC ............ *H03F 1/025* (2013.01); *H03F 1/3241* (2013.01); *H03F 3/189* (2013.01); *H03F 3/245* (2013.01); *H03F 2200/507* (2013.01); *H03F 2200/511* (2013.01); *H03F 2200/555* (2013.01)

(58) Field of Classification Search
CPC ...... H03F 1/025; H03F 1/3241; H03F 3/189; H03F 3/245; H03F 2200/507; H03F 2200/511; H03F 2200/555
USPC ......... 363/17, 59–61, 65, 67, 69, 84, 95, 97, 363/21.02–21.03; 307/109–110; 327/536–537; 330/127, 136, 297
See application file for complete search history.

(56) References Cited

U.S. PATENT DOCUMENTS

| | | | |
|---|---|---|---|
| 4,322,817 A * | 3/1982 | Kuster | 363/26 |
| 6,437,538 B1 * | 8/2002 | Tsurumi et al. | 320/116 |
| 6,577,510 B1 * | 6/2003 | Yasumura | 363/21.02 |
| 7,187,565 B2 * | 3/2007 | Chae | 363/69 |
| 8,253,487 B2 * | 8/2012 | Hou et al. | 330/127 |
| 8,508,157 B2 * | 8/2013 | Kim et al. | 315/308 |
| 8,531,125 B2 * | 9/2013 | Kim et al. | 315/279 |
| 2009/0244934 A1 * | 10/2009 | Wang et al. | 363/21.06 |
| 2010/0135045 A1 * | 6/2010 | Inoue | 363/17 |

(Continued)

OTHER PUBLICATIONS

Guoxing Zhang; Junming Zhang; Zhao Chen; Xinke Wu; Zhaoming Qian, "LLC resonant DC/DC converter with current-driven synchronized voltage-doubler rectifier," Energy Conversion Congress and Exposition, 2009. ECCE 2009. IEEE , vol., No., pp. 744,749, Sep. 20-24, 2009.*

(Continued)

*Primary Examiner* — Timothy J Dole
*Assistant Examiner* — Ivan Laboy Andino
(74) *Attorney, Agent, or Firm* — William B. Kempler; Frank D. Cimino

(57) ABSTRACT

An envelope tracking power supply has a multiple-output DC/DC converter, having an alternating current generating portion and a full rectifying portion. The alternating current generating portion to receive an input voltage and operate at zero voltage switching. A full rectifying portion includes at least one secondary winding and one voltage doubler output. each having a first transistor, and a second transistor, used as rectifier devices to allow currents to flow bi-directionally and sink and source the currents from and to output capacitors to keep their voltage balance. A switch bank selects a desired voltage from series connected capacitors and connects it to an output filter. The switch bank receives an envelope tracking command from the voltage selector and provides a step voltage to the output. The output voltage is changed at switching speed to track a high bandwidth envelope signal.

13 Claims, 4 Drawing Sheets

(56) References Cited

U.S. PATENT DOCUMENTS

| | | | |
|---|---|---|---|
| 2010/0237799 A1* | 9/2010 | Choi et al. | 315/294 |
| 2010/0253665 A1* | 10/2010 | Choi et al. | 345/211 |
| 2012/0007425 A1* | 1/2012 | Rozman et al. | 307/25 |
| 2012/0161858 A1* | 6/2012 | Permuy et al. | 327/536 |

OTHER PUBLICATIONS

"GC5325 Envelope Tracking Application Report," Texas Instruments Incorporated, Jan. 2010—Revised Apr. 2010, pp. 1-12 (Ken Chan).

* cited by examiner

SYSTEM AND METHOD FOR ENVELOPE TRACKING POWER SUPPLY

BACKGROUND

Conventional wireless systems currently have a power-conversion efficiency as low as 15%. In particular, in a conventional wireless system, an only about 15% of the input power is transmitted with the transmitted signal.

Conventionally, a constant DC output voltage is used to power a wireless system to transmit a signal. The power used for transmission is only a small fraction of the total power supplied by the constant DC output power supply. The power loss, caused by inefficient operation of the power amplifier, unnecessarily heats the power amplifier's components.

What is needed is an improved power supply with variable voltage output and whose output that tracks the peak voltage envelope of the power amplifier output to decrease the power amplifier power loss.

BRIEF SUMMARY

A system and method are provided for improving wireless system power efficiency with a variable output power supply, which tracks the envelope of the power amplifier's output to decrease the power amplifier power loss.

In accordance with an aspect of the present invention, an embodiment includes a DC/DC converter with multiple outputs, a switch bank to select a desired output voltage and an output filter. The DC/DC converter has an alternating current generating portion and a rectification portion and a control portion. The alternating current generating portion can receive an input voltage and includes a first input transistor, a second input transistor, an inductor, a first capacitor, a second capacitor and a first transformer winding. The first input transistor and the second input transistor can generate a primary alternating current through the first transformer winding based on the input voltage and gate driver signals. The full rectification portion includes at least two transformer secondary windings, denoted as a second transformer winding and a third transformer winding, and a voltage doubler having a first transistor, a second transistor, a first capacitor, a second capacitor and a full wave rectifier having a third transistor, a fourth transistor and a third capacitor. The second transformer winding can generate a first secondary alternating current based on the primary alternating current. The alternating current passes the first transistor in a first direction to charge the first capacitor. The alternating current passes the second transistor in a second direction to charge the second capacitor. The first and the second capacitor can store charge based on the first secondary alternating current.

The third transformer winding, which has a center tap and two sections of winding, can generate a second secondary alternating current based on the primary alternating current. The alternating current passes the third transistor and the fourth transistor alternatively to charge the third capacitor. The third capacitor can store this charge.

A controller receives the third capacitor voltage and compares with internal reference set value to generate a primary digital pulse-width-modulated (DPWM) signal and a secondary DPWM signal. The primary DPWM signal is used to drive two primary transistors, and the secondary DPWM signal is used to drive a set of rectification switches, the secondary transistors. In a more general way, a transistor is called a "switch" herein. The secondary rectification switches can also be driven by gate drive signals from the current transformer. The controller closes voltage control to regulate the third capacitor voltage. Since all secondary windings are tightly coupled, all other secondary capacitors' voltages are also regulated accordingly.

A switch bank includes multiple switches. The switch bank receives on and of signals from a driver, whose input signals are often from a digital predistortion controller. At any moment, only one switch is selected, to provide selected voltage to the output filter. By using the switch bank, an envelope tracking (ET) power supply can enable a rapid change of its output voltage to track the power amplifier peak voltage output.

Additional advantages and novel features of the invention are set forth in part in the description which follows, and in part will become apparent to those skilled in the art upon examination of the following or may be learned by practice of the invention. The advantages of the invention may be realized and attained by way of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings:

FIG. 1A illustrates an example of a DC/DC converter with multiple outputs in accordance with an aspect of the present invention;

FIG. 3A illustrates the power consumed by a conventional power amplifier, whereas

DETAILED DESCRIPTION

Figure 1B:
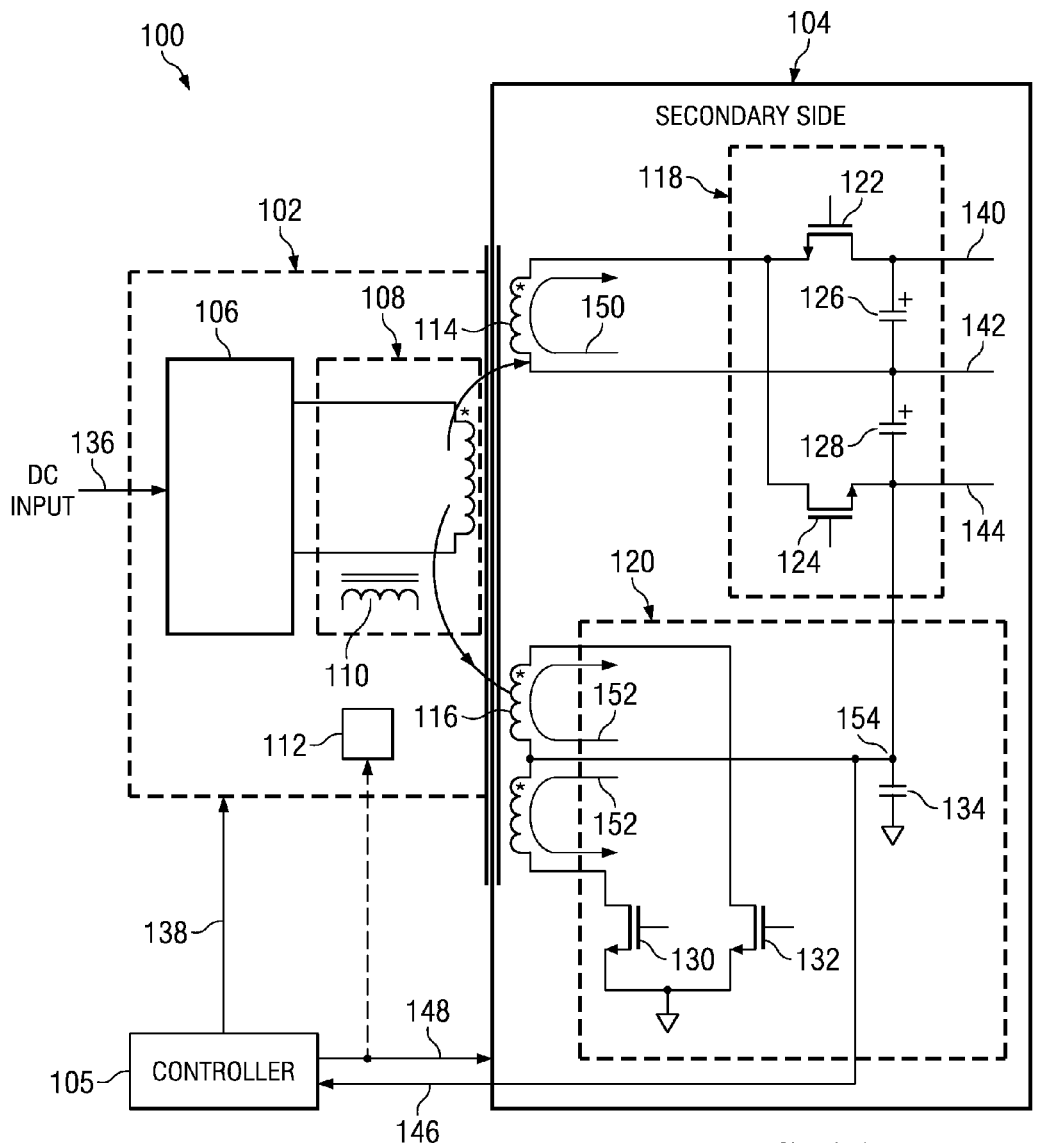
FIG. 1B illustrates an example embodiment of a driving portion.
Figure 1B:
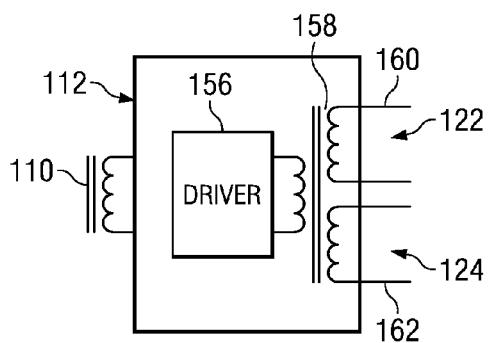

In accordance with an aspect of the present invention, a system and method provides an efficient power source that tracks the envelope of a power amplifier's output voltage to decrease the system's power loss, mainly the power amplifier's power loss. In an example embodiment, a power supply is operable to output a step voltage that corresponds to the amplitude of a signal to be transmitted by a power amplifier therefore minimizing the power amplifier's power loss.

An aspect in accordance with the present invention will now be described with reference to FIGS. 1-5.

FIG. 1A illustrates an example of a DC/DC converter 100 with multiple outputs in accordance with an aspect of the present invention.

As illustrated in the figure, DC/DC converter 100 includes a primary side 102, a secondary side 104 and a controller 105. Primary side 102 includes a switching network 106, a primary winding 108, a current transformer 110 and driving portion 112. Secondary side 104 includes secondary windings 114 and 116, a transistor-capacitor bank 118 and a full-wave rectifier 120. Transistor-capacitor bank 118 includes transistors 122 and 124, and capacitors 128 and 126. Full-wave rectifier 120 includes transistors 130 and 132 and capacitor 134.

Primary side 102 is arranged to receive a DC input 136 and a switch driver signal 138. Primary side 102 is also arranged to produce a magnetic field by way of switching network 106, which includes inductors, capacitors and switches. An example switching network 106 includes a half-bridge LLC converter configuration. An example LLC converter will be described in greater detail later. Secondary side 104 is arranged to receive the magnetic field from primary side 102 and to generate multiple outputs at nodes 140, 142 and 144. One of the outputs, such as 144, can be used to generate a feedback signal 146. Controller 105 is arranged to receive feedback signal 146 from secondary side 104 and generate switch driver signal 138 for switches (not shown) in primary side 102 and signal 148 for transistors 122, 124, 130 and 132 at secondary side 104.

Primary side 102 generates a magnetic field, based on switch driver signal 138 and DC input 136. Secondary side 104 receives the magnetic field and induced currents 150 and 152 are generated. Controller 105 provides switch driver signal 138 to primary side 102 and signal 148 to secondary side, based on feedback signal 146, to modulate primary side 102 magnetic field. Primary side 102 modulates magnetic field to generate induced currents 150 and 152 on secondary side 104.

Primary winding 108 is operable to generate a magnetic field based on DC input 136 and switch driver signal 138. In an example embodiment, DC input 136 powers switching network 106 to generate alternative current passing through primary winding 108. The generated magnetic field is modulated by switch driver signal 138, received from controller 105, as will be discussed further below.

Secondary winding 114 is operable to generate induced current 150 based on the magnetic field generated by primary winding 108. In an example embodiment, induced current 150 is routed through transistor 122 and transistor 124 and charges capacitor 126 and capacitor 128, respectively. Alternatively, more secondary windings may be added to cascade with secondary winding 114, and induced currents charge more cascaded capacitors by corresponding transistors, as will be described later with reference to FIG. 5.

Secondary winding 116 is operable to generate induced current 152 based on the magnetic field generated by primary winding 108. Induced current 152 is routed through transistor 130 and transistor 132 and charges capacitor 134.

Current transformer 110 is operable to generate current a sensing signal based on the current of primary winding 108. The current generated by current transformer 110 may be used by driving portion 112. This will be described in greater detail below with reference to FIG. 1B.

In operation, a changing DC input 136 passes through switching network 106 altering the current such that primary winding 108 generates a changing magnetic field. This changing magnetic field induces currents 150 and 152 within secondary windings 114 and 116. Induced current 150 is routed through transistor-capacitor pair bank 118. In particular, induced current 150 passes to transistor 122 during a positive cycle and passes to transistor 124 during a negative cycle. When transistor 122 is active, and when induced current 150 is in a positive cycle, transistor 122 passes induced current 150 to charge capacitor 126. Accordingly, capacitor 126 is able to store a charge during a positive current cycle. When transistor 124 is active, and when induced current 150 is in a negative cycle, transistor 124 passes induced current 150 to charge capacitor 128. Accordingly, capacitor 128 is able to store a charge during a negative current cycle. Charges accumulated by capacitor 126 and capacitor 128 may be provided an output voltage (i.e., discharged to a load, not shown).

Induced current 152 passes to transistor 130 during a positive cycle and passes to transistor 132 during a negative cycle. Transistor 130 is active when induced current 152 is in a positive cycle, and charges capacitor 134. Transistor 132 is active when induced current 152 is in a negative cycle, and charges capacitor 134. Accordingly, capacitor 134 is able to store a charge during both positive and negative current cycles. Charge accumulated by capacitor 134 may be provided an output voltage (i.e., discharged to a load, not shown).

Secondary winding 114 and secondary winding 116 are mutually coupled and transistors are used to replace diodes for secondary rectification. When the transistors are turned on, they can conduct current bi-directionally. Such a configuration allows a capacitor with higher voltage to be discharged to the other capacitors by the magnetic coupling and maintain voltage balance according the transformer secondary winding turn ratios. Accumulated charge in all capacitors can be discharged to a load if the load is connected to one capacitor or any number of cascaded capacitors. All capacitor voltages still maintain balanced according to the transformer secondary winding turn radio during this discharging process. The mechanism of voltage balancing will be described further below.

A selected output voltage may be the voltage supplied by capacitor 126, capacitor 128 or capacitor 134, or a combination thereof, to produce a stepped voltage, and in this manner effect a rapid change of output voltage.

Figure 1C:
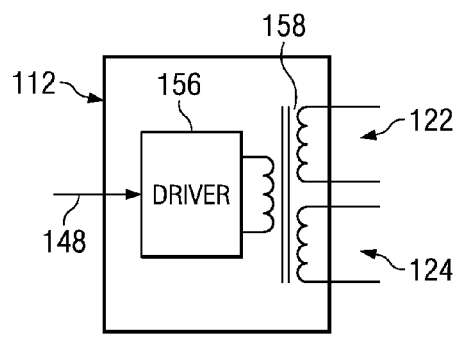
FIG. 1C illustrates another example embodiment of a driving portion.

Transistors 122, 124, 130 and 132 are controlled by gate driver signals, as shown in FIGS. 1B and 1C.

FIG. 1B illustrates an exploded view of an example embodiment of driving portion 112.

As illustrated in the figure, driving portion 112 includes driving circuitry 156, a transformer 158, an output 160 and an output 162.

Driving circuitry 156 is operable to generate a driving voltage based on the current sensing signal generated by current transformer 110. The driving voltage is then transferred to output portion 160 and output portion 162 via transformer 158. The voltage transferred to output portion 160 controls transistor 122 of transistor-capacitor bank 118. The voltage transferred to output portion 162 controls transistor 124 of transistor-capacitor bank 118.

FIG. 1C illustrates an exploded view of another example embodiment of driving portion 112.

As illustrated in the figure, in this example embodiment, driving portion 112 is not arranged to generate a voltage based on the current sensing signal generated by current transformer 110. In this example, driving circuitry 156 is operable to generate a driving voltage based on signal 148 from controller 105.

Returning to FIG. 1A, transistor 122 and transistor 124 constitute a pair, and together function with secondary winding 114 and output capacitors 126 and 128 to form a voltage doubler. A voltage doubler is operable to output a voltage across two output capacitors having a maximum amplitude that is twice the maximum amplitude of its input voltage. Two currents, one negative and one positive, are generated using both half-cycles of the incoming AC current wave. In this example, the output voltage is the sum of the voltage stored in capacitor 128 and the voltage stored in capacitor 126 or twice the peak voltage of secondary winding 114. The gates of transistors 122 and 130 are high, or ON, during a positive cycle of the control signal, whereas the gates of transistors 124 and 132 are high, or ON, during a negative cycle of the control signal. The control signal may activate transistor 122 during a positive cycle of induced current 150, allowing capacitor 126 to store a charge. This charge may be output to node 140. Control signal may activate transistor 124 during a negative cycle of induced current 150, allowing capacitor 128 to store a charge. This charge may be output to node 142. Capacitor 134 stores a charge in both positive and negative half cycles. A voltage based on this charge will be present at node 144.

Controller 105 receives feedback signal 146 allowing it to sense voltage levels from secondary side 104, usually from capacitor 134, and provide switch driver signal 138 to primary side 102 to modulate the current of switching network 106 to influence magnetic field of primary winding 108 if required. A current signal from primary winding 108 may be used to control secondary transistors 122, 124, 130 and 132 on secondary side 104. Secondary side 104 provides a single feedback signal 146 to controller 105 to control the entire loop. Controller 105 receives feedback signal 146 that determines the required output voltage on secondary side 104, particularly baseline voltage at node 154.

As discussed above with reference to FIG. 1B, a current signal from primary winding 108 can be used to control secondary transistors 122, 124, 130 and 132 on secondary side 104. The current signal of primary winding 108 is sensed by a current transformer 110, as will be described in greater detail later with reference to FIG. 5, the signal is transferred to multiple isolated and amplified gate driver signals for all secondary transistors. Controller 105 can also be an alliterative source to produce signal 148 for secondary transistor control, as discussed above with reference to FIG. 1C. In such cases, signal 148 is transferred to multiple isolated and amplified gate driver signals for all secondary transistors.

Capacitor 134 enables a precise charge to be equally stored on capacitor 126 and capacitor 128. For purposes of explanation, assume that during a positive cycle, capacitor 126 is supposed to store 3.3 V and during a negative cycle, capacitor 128 is additionally supposed to store 3.3 V. However, presume that during a positive cycle, capacitor 126 actually stores 4.0 V, whereas capacitor 128 stores 3.3 V. In this situation, the extra 0.7 V stored on capacitor 126 will be discharged to capacitor 134 by way of the coupling between secondary winding 114 and secondary winding 116.

The increased 0.7 V on capacitor 134 will be reflected in feedback signal 146, which will be reflected in switch driver signal 138. Switch driver signal 138 will therefore instruct primary side 102 to increase the frequency of the current through primary winding 108, to decrease the induced magnetic field through secondary winding 114. The decreased magnetic field through secondary winding 114 will decrease the induced current through secondary transistors 122 and 124. The decreased current through secondary transistors 122 and 124 will decrease the charge on both capacitor 126 (in the positive cycle) and capacitor 128 (in the negative cycle).

In this example, capacitor 126 will now store the expected 3.3 V as a result of the decreased current. Accordingly, the previous increase of 0.7 V has been eliminated. However, capacitor 128 will now store 2.6 V as a result of the decreased current. In particular, capacitor 128 had stored the correct voltage of 3.3 V before the current was reduced. Nevertheless, the additional 0.7 V residing on capacitor 134 (that had been transferred from capacitor 126) will be transferred to capacitor 128 by way of the coupling between secondary winding 114 and secondary winding 116.

In other words, if there is an excess of charge on one of capacitor 126 and capacitor 128, the excess charge will be temporarily transferred to capacitor 134. After the driving current is reduced, to account for the excess of charge on the capacitor, then the charge on both capacitor 126 and capacitor 128 is reduced. At that point, the excess charge that was temporarily transferred to capacitor 134 will then be transferred to the other of capacitor 126 and capacitor 128. Accordingly, a precise charge is maintained on both capacitors.

The feedback mechanism discussed above will additionally address situations where insufficient charge is stored on a capacitor. This will now be described in greater detail.

For purposes of explanation, presume that during a positive cycle, capacitor 126 is supposed to store 3.3 V and during a negative cycle, capacitor 128 is additionally supposed to store 3.3 V. However, presume that during a positive cycle, capacitor 126 actually stores 2.6 V, whereas capacitor 128 stores 3.3 V. In this situation, the required 0.7 V will be transferred from capacitor 134 and stored on capacitor 126 by way of the coupling between secondary winding 114 and secondary winding 116.

The decreased 0.7 V on capacitor 134 will be reflected in feedback signal 146, which will be reflected in switch driver signal 138. Switch driver signal 138 will therefore instruct primary side 102 to decrease the frequency of the current through primary winding 108, to increase the induced magnetic field through secondary winding 114. The increased magnetic field through secondary winding 114 will increase the induced current through secondary transistors 122 and 124. The increased current through secondary transistors 122 and 124 will increase the charge on both capacitor 126 (in the positive cycle) and capacitor 128 (in the negative cycle).

In this example, capacitor 126 will now store the expected 3.3 V as a result of the increased current. The previous 0.7 V has been eliminated. However, capacitor 128 will now store 4.0 V as a result of the increased current. Capacitor 128 had stored the correct voltage of 3.3 V before the current was increased. The excess 0.7 V on capacitor 128 will be transferred to capacitor 134 by way of the coupling between secondary winding 114 and secondary winding 116.

In other words, if there is an insufficient charge on either capacitor 126 or capacitor 128, capacitor 134 will temporarily transfer the required charge. After the driving current is increased, to account for the decrease of charge on the capacitor, then the charge on both capacitor 126 and capacitor 128 is increased. At that time, the excess charge on capacitor 126 or capacitor 128 will be returned to capacitor 134. Accordingly, a precise charge is maintained on both capacitors.

This aspect of the present invention provides the benefit of generating, with a single primary alternating current, a plurality of precise voltages from well coupled windings. The voltage precision is achieved because of closed-loop control and the ability to finely step the output as a result of a plurality of voltages generated from well coupled windings. Therefore, a single converter with multiple output voltages, may switch from one voltage to the other, or combine voltages, to produce a rapid change of voltage applied to the power supply.

This aspect of the present invention may be utilized for different purposes, two examples of which will now be described below.

A first example application of generating an output voltage, with a single primary alternating current, improves a wireless power system's power conversion efficiency by tracking the envelope of a signal to be transmitted. This example application will now be described with reference to FIGS. 2-5.

Figure 2:
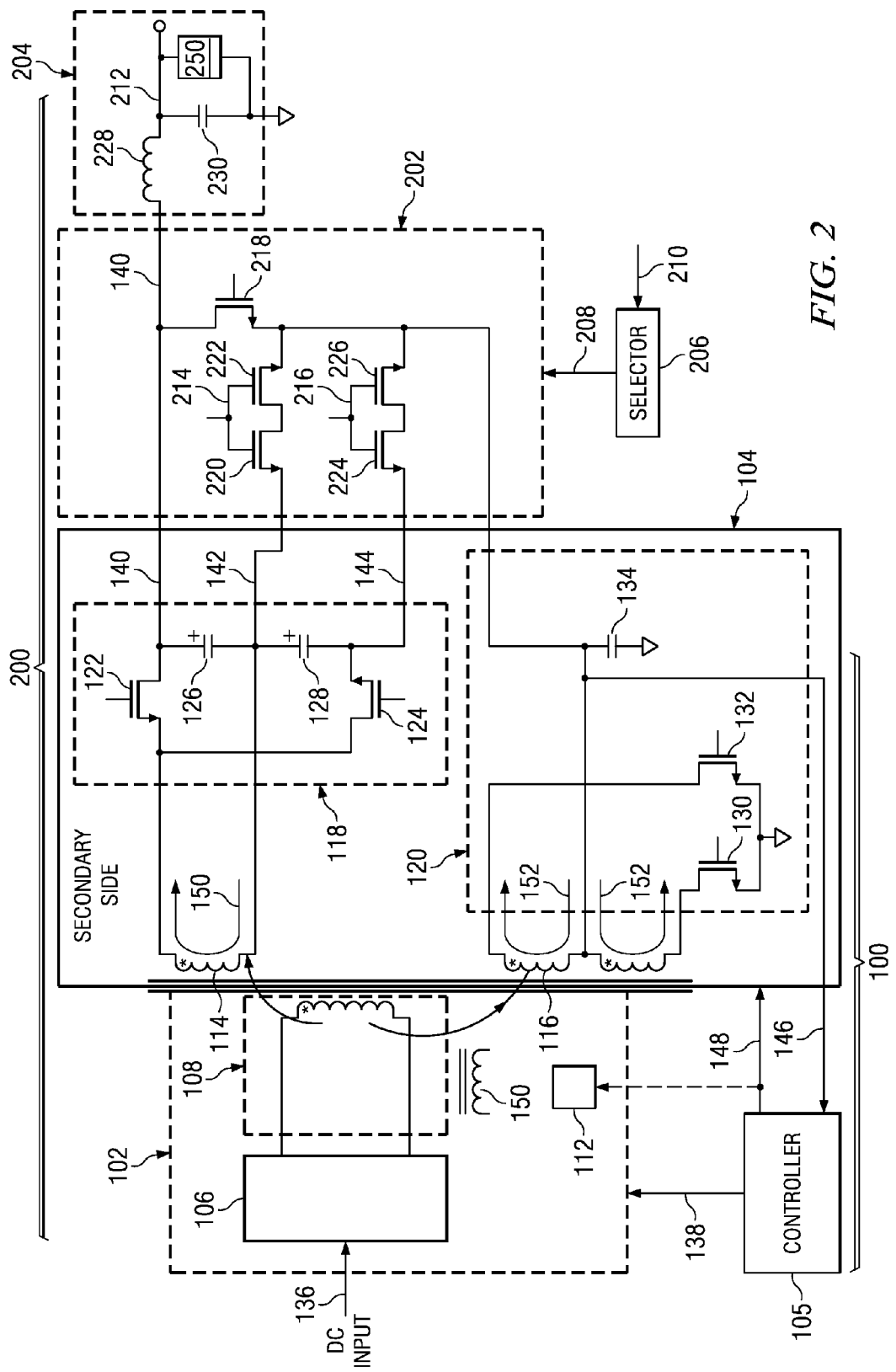
FIG. 2 illustrates an example of an Envelope Tracking Power Supply in accordance with another aspect of the present invention.

FIG. 2 illustrates an example envelope-tracking power supply 200 in accordance with another aspect of the present invention.

As illustrated in the figure, envelope-tracking power supply 200 includes DC/DC converter 100, a switch-bank 202, an output filter 204 and a selector 206.

Switch bank 202 is arranged to receive a voltage from DC/DC converter 100 and to output a voltage at node 140. Switch bank 202 is also arranged to receive a selector signal 208. Selector 206 is arranged to receive an instruction signal 210 and to generate selector signal 208. Selector signal 208 turns on only one switch within switch bank 202, at any time, to select one desired output voltage. Output filter 204 is arranged to supply filtered voltage 212 from the switch-bank 202 to the power supply 200 (not shown).

Selector 206 instructs, via selector signal 208, switch bank 202 to apply an output voltage at node 140 as one of the combined voltages of capacitors 126, 128 and 134. Output filter 204 smoothes the sequence of step output voltages.

Switch bank 202 includes a switch-pair 214, a switch-pair 216 and a transistor 218. Switch-pair 214 includes a transistor 220 and a transistor 222. Switch-pair 216 includes a transistor 224 and a transistor 226. Both switch-pair 214 and 216 are bidirectional switches.

Output filter 204 includes an inductor 228 and a capacitor 230. Inductor 228 is disposed to receive output voltage from node 140. Capacitor 230 is connected between inductor 228 and ground. Inductor 228 and capacitor 230 are arranged to provide filtered voltage 212. A damping network 250 may be added to output filter 204 if needed.

In operation, DC/DC converter 100 provides voltages at nodes 140, 142 and 144. Instruction signal 210 activates selector 206 to instruct switch bank 202 to output one of three possible voltages to filter 204. In this example embodiment, a first voltage is the voltage of capacitor 134, a second voltage is the sum of the voltages of capacitors 134 and 128 and a third voltage is the sum of the voltages of capacitors 134, 128 and 126.

Selector 206 outputs selector signal 208 based on instruction signal 210. Switches 214 and 216 and transistor 218 may be actuated based on selector signal 208. In other words, in this example: a binary value 00 in selector signal 208 will provide capacitor 134 voltage value at node 140; a binary value 01 in selector signal 208 will provide a voltage value corresponding to the sum of capacitor voltages of 134 and 128; and a binary value 10 in selector signal 208 will provide a voltage value corresponding to the sum of the charge stored on capacitors 128, 126 and at node 140.

In this example embodiment, each switch 214 and 216 includes two MOSFETs configured as a bidirectional switch. However, any known switching mechanism may be used.

Inductor 228 and capacitor 230 form a low-pass filter, which limits an output step voltage slew rate and filters out high frequency components. A damping circuit can be added to minimize output ringing if needed.

Controller 105 receives feedback signal 146 allowing it to sense voltage levels from secondary side 104 and provide the desired switch driver signal 138 to primary side 102 to modulate the current in primary winding 108 and the related magnetic field if required.

Envelope-tracking power supply 200 includes a switch bank to switch its output voltages from one value to the other at a very rapid rate. The voltage output of envelope-tracking power supply 200 is changed dynamically, tracks the envelope of output RF signal's voltage and remains closely matched to the envelope. This is possible due to the constant or stiff output voltages of DC/DC converter 100 that are rapidly led as output voltages to match, and thereby reduce the voltage difference with, the RF signal envelope. The readily available voltage stored in capacitors 126, 128 and 134 is supplied by switch bank 202 singly, or additively, as the output voltage required to match the transmitted RF signal. The output voltage of envelope-tracking power supply 200 is supplied by DC/DC converter 100 and by selector 206 which allocates which switch to activate to minimize, voltage difference with transmitted RF signal's voltage envelope.

Thus, a power amplifier or transmitter using envelope-tracking power supply 200 for signal transmission in accordance with an aspect of the present invention may significantly reduce wasted power. This will be described below with reference to FIGS. 3A and 3B.

Figure 3A:
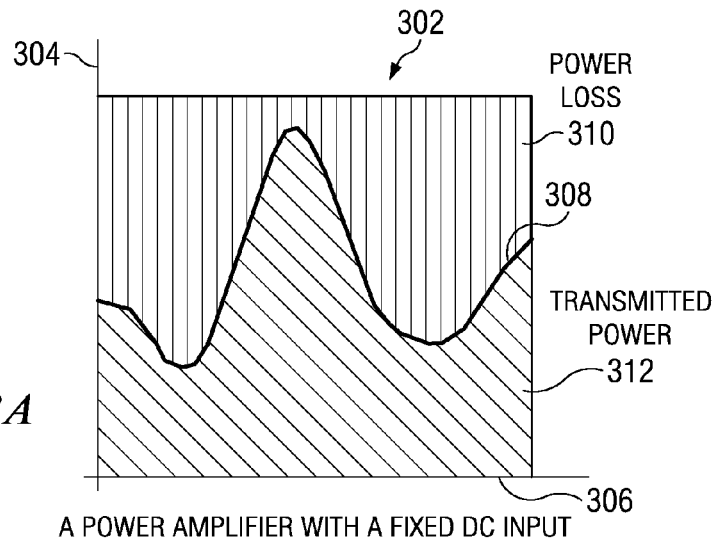
Figure 3B:
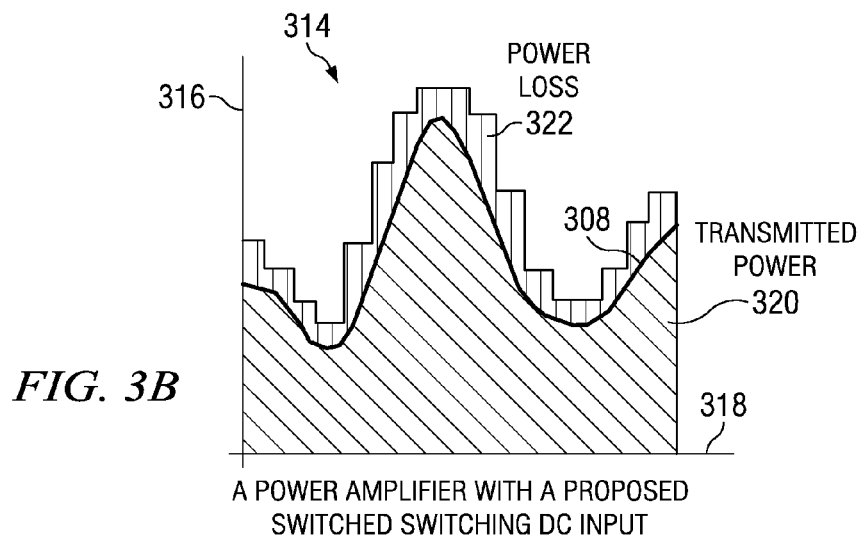
FIG. 3B illustrates power consumed by a power amplifier powered by an Envelope Tracking (ET) power supply with an aspect of the present invention.

FIG. 3A illustrates the power consumed by a conventional transmitter, whereas FIG. 3B illustrates power consumed by a transmitter in accordance with an aspect of the present invention.

FIG. 3A includes a graph 302 having power on a y-axis 304 and time on an x-axis 306. A function 308 represents a signal that is transmitted. A constant DC output power supply is used in the conventional transmitter. A DC output voltage for such a power supply is shown as a flat line as illustrated by power dissipation loss 310 in FIG. 3A. The area 312 below function 308 is the amount of power consumed by the conventional transmitter when transmitting. The area 310 above function 308 is power lost by a conventional transmitter when transmitting the signal.

FIG. 3B includes a graph 314 having power on a y-axis 316 and time on the x-axis 318. Function 308 again represents the transmitted signal. In contrast with the conventional transmitter example discussed above with reference to FIG. 3A, the power supply is stepped to track the signal to be transmitted. As shown in FIG. 3B, the area 320 below function 308 is the amount of power consumed by the transmitter when transmitting. The area 322 above function 308 is power lost by a transmitter in accordance with an aspect of the present invention when transmitting the signal.

Function 308 may be considered an "envelope" that contains information that will be transmitted. In accordance with an aspect of the present invention, the power consumed by a transmitter "tracks" the "envelope". This envelope tracking (ET) provides a significantly decreased power loss 322 in accordance with an aspect of the present invention.

It is difficult to design a switching power converter with a single feedback loop while tightly regulating multiple outputs and achieve over 1 MHz voltage loop bandwidth. Aspects of the present invention resolve this technical difficulty with a step output voltage to replace smooth output voltage and achieve high bandwidth, high efficiency with a low cost circuit. In particular, an example aspect of the present invention has the unique characteristic of equalizing multiple output voltages with a simple feedback loop.

An example aspect of the present invention manages power loss in wireless systems by improving power conversion efficiency with a low cost structure and a simple control scheme for envelope tracking. This will be discussed in more detail with reference to FIG. 4.

Figure 4:
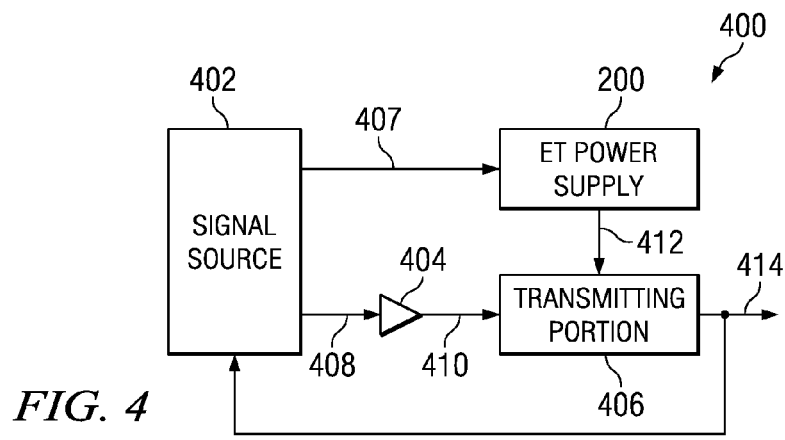
FIG. 4 illustrates an example transmitter system in accordance with an aspect of the present invention.

FIG. 4 illustrates an example transmitter system 400 in accordance with an aspect of the present invention.

As illustrated in the figure, transmitter system 400 includes a signal source 402, envelope-tracking power supply 200, a delay 404 and a transmitting portion 406, which is usually a power amplifier.

Signal source 402 is operable to provide a source signal 408 having information to be transmitted. Envelope-tracking power supply 200 is arranged to output an envelope tracking voltage 412 based on an envelope command 407 from signal source 402. Envelope command 407 is generated based on RF input signal 408 and the amplitude of RF output signal 414. In an example embodiment, envelope-tracking power supply 200 receives source signal 407 directly from signal source 402. Delay 404 may be arranged to output a delayed source signal 410 based on source signal 408. In an example embodiment, delay 404 receives source signal 408 directly from signal source 402. Transmitting portion 406 is arranged to output a transmitted signal 414 based on delayed source signal 410 and voltage 412 provided by envelope-tracking power supply 200. Transmitting portion 406 receives an envelope tracking voltage 412 directly from envelope-tracking power supply 200.

Transmitter system 400 may be a unitary device, wherein each of signal source 402, envelope-tracking power supply 200, delay 404 and transmitting portion 406 are a single device. In some embodiments, transmitter system 400 is not a unitary device, wherein at least one of signal source 402, envelope-tracking power supply 200, delay 404 and transmitting portion 406 is a separate device.

Signal source 402 generates source signal 408. Source signal 408 is delayed by delay 404 to generate delayed signal 410. For purposes of discussion, assume that delayed signal 410 corresponds to function 308 of FIG. 3B. Transmitting portion 406 is generally tasked with transmitting a signal. However, transmitting portion 406 must be powered in order to transmit a signal. In this case, driving signal 412, which is the variable voltage output of envelope-tracking power supply 200, provides power to transmitting portion 406 enabling delayed signal 410 to be produced as transmitted signal 414.

In a conventional transmission system, a transmitting portion uses a constant voltage power supply. This will result in drastic power loss as discussed above with reference to FIG. 3A. However, in accordance with an aspect of the present invention, transmitting portion 406 is powered by only a sufficient voltage required to transmit delayed signal 410. The sufficient voltage value provided by envelope-tracking power supply 200 is dictated by the amplitude of transmitted signal 414 and source signal 408.

The purpose of delay 404 is to compensate for the internal delay of envelope-tracking power supply 200 and ensure that envelope-tracking power supply 200 provides driving signal 412 in phase with the signal 414 to be transmitted.

The example embodiment discussed above with reference to FIG. 2, merely demonstrates the ability of an aspect of the present invention to provide controlled, stepped output voltage levels. It should be known that the number of levels is not limited.

In the embodiment discussed above with reference to FIG. 2, a single voltage doubler is used. However, in accordance with an aspect of the present invention a plurality of voltage doublers may be used with a single secondary winding. In particular, suppose a single secondary winding is used to provide current to an integer number M of voltage doublers. In order to provide an equal voltage to each voltage doubler, then the turns of the secondary winding should be equally divided between the voltage doublers. Therefore, if the single secondary winding has n turns, each voltage doubler will tap off the secondary winding at n/M turns. This will be described in more detail below with reference to FIG. 5, wherein another example embodiment uses three voltage doublers, i.e., M=3.

Figure 5:
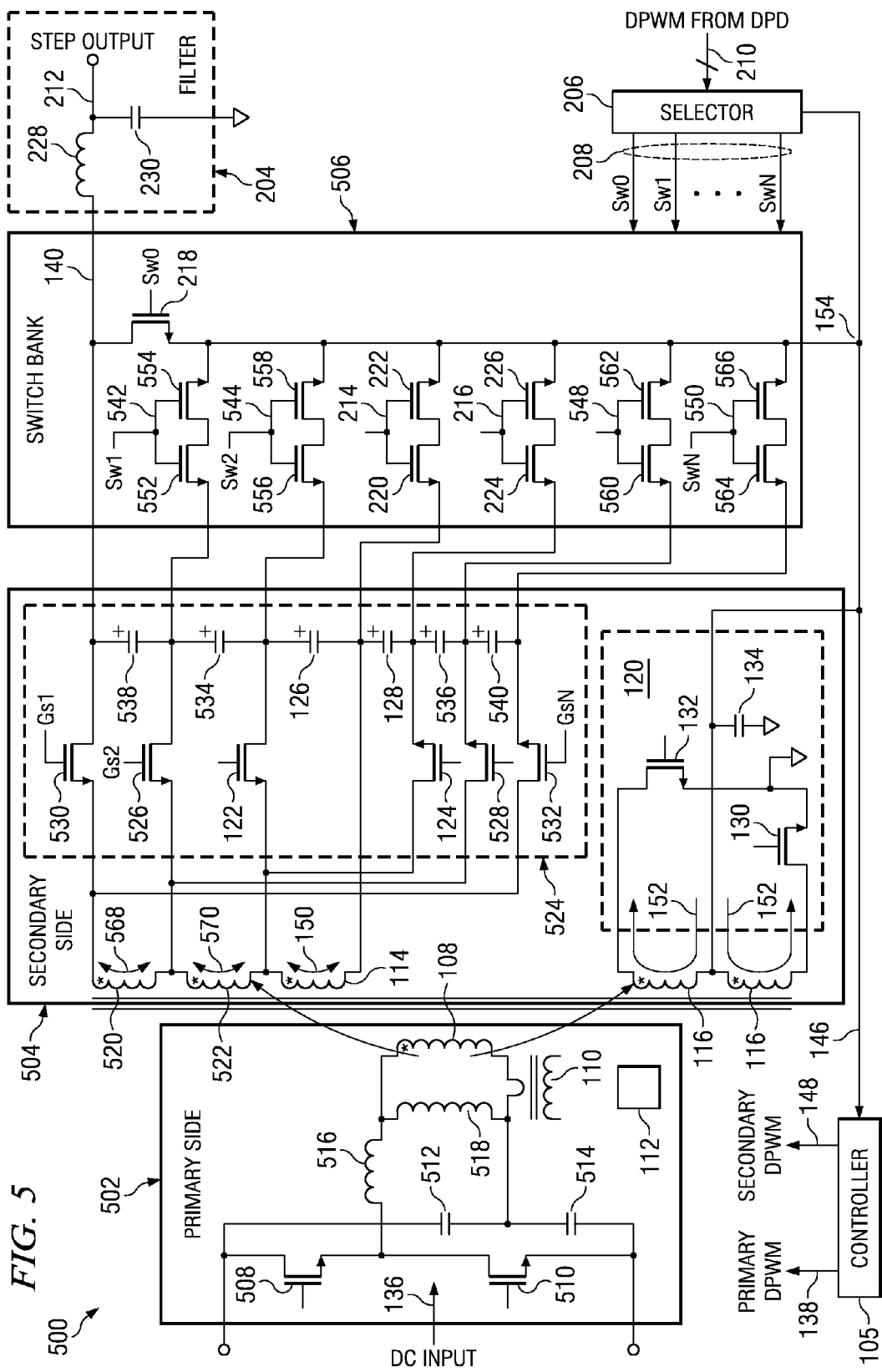
FIG. 5 illustrates an example of an Envelope Tracking power supply in accordance with another aspect of the present invention.

FIG. 5 illustrates an example power supply 500 in accordance with another aspect of the present invention.

As illustrated in the figure, power supply 500 includes a primary side 502, a secondary side 504, a switch bank 506, controller 105, selector 206 and output filter 204.

Primary side 502 includes transistors 508 and 510, capacitors 512 and 514, and inductors 516 and 518, a current transformer and primary winding 108.

Secondary side 504 includes secondary windings 114, 520 and 522, and a transistor-capacitor bank 524. Transistor-capacitor bank 524 includes transistors 122, 124, 130, 132, 530, 526, 528 and 532 and capacitors 128, 126, 134, 538, 534 and 540.

Switch bank 506 includes switch pairs 214, 216, 542, 544, 548 and 550 and switch 218. Switch pair 542 includes a transistor 552 and a transistor 554; switch pair 544 includes a transistor 556 and a transistor 558; switch pair 548 includes a transistor 560 and a transistor 562; switch pair 550 includes a transistor 564 and a transistor 566. The gates and drains of two transistors, such as MOSFETs, are tired together to form a bi-direction switch. Other configurations are also possible. Typically, a 12V gate voltage applied to either one of the gates can turn the two MOSFET on.

Primary side 502 may be a resonant converter configuration, such as LLC resonant converter, which operates at current source mode. Primary side 502 is arranged to receive DC input 136 and switch driver signal 138. Primary side 502 is also arranged to produce a variable magnetic field. Secondary side 504 is arranged to receive the magnetic field from primary side 502 thereby charging capacitors 540, 536, 128, 126, 534 and 538. A baseline output voltage at capacitor 134 may be used as a feedback signal 146. Controller 105 is arranged to receive feedback signal 146 from secondary side 504 and output corresponding switch driver signal 138 for transistors at primary side 502 and signal 148 for transistors on secondary side 504. Controller 105 is able to output switch driver signal 138 to drive transistor 508 and transistor 510.

Primary side 502 generates a magnetic field, which is coupled to secondary windings 520, 522, 114 and 116 and induces currents 568, 570, 150 and 152, respectively. Controller 105 provides switch driver signal 138 to primary side 502, based on feedback signal 146, to modulate primary side 502 magnetic field and regulate output voltage of capacitor 134. Controller 105 also provides signal 148 to secondary transistors 530, 526, 122, 124, 528, 532, 130 and 132.

In an example embodiment, an LLC converter primary side includes bridge transistors 508 and 510, series inductor 516, parallel inductor 518 and capacitors 512 and 514. This converter's primary side has two inductors and one capacitor. For this reason, it is called an LLC converter. Inductor 518 is paralleled with transformer primary winding 108. The LLC converter receives variable DC input 136. Switch driver signal 138 activates the resonant LLC circuit producing an AC current in the primary winding 108. The AC current generates a corresponding magnetic field, as mentioned above. Other power topologies, such as a full bridge LLC converter, can also be used to generate a current for primary winding 108. Feedback signal 146 is generated from the baseline voltage at node 154. Controller 105 generates switch driver signal 138 to regulate the voltage at node 154.

Secondary side 504 includes a secondary winding 114, secondary winding 522 and secondary winding 520, arranged in cascade, to generate six output voltages by using a voltage doubler configuration. Secondary winding 116 generates a baseline voltage at node 154.

Secondary winding 114 is operable to generate induced current 150 based on the magnetic field generated by primary winding 108. In an example embodiment, induced current 150 is routed through transistor 122 and transistor 124. The current then charges capacitor 126 in a positive cycle through transistor 122 and charges capacitor 128 in a negative cycle through transistor 124.

Secondary winding 522 is operable to generate induced current 570 based on the magnetic field generated by primary winding 108. In an example embodiment, induced current 570 is routed through transistor 526 and transistor 528. The current then charges capacitor 534 in a positive cycle through transistor 526 and charges capacitor 536 in a negative cycle through transistor 528.

Secondary winding 520 is operable to generate induced current 568 based on the magnetic field generated by primary winding 108. In this example, induced current 568 is routed through transistor 530 and transistor 532. Current 568 then charges capacitor 538 in a positive cycle through transistor 530, and charges capacitor 540 in a negative cycle through transistor 532.

Secondary winding 116 is operable to generate induced current 152 based on the magnetic field generated by primary winding 108. In this example embodiment, induced current 152 is routed through transistor 130 and transistor 132 charging capacitor 134 in both positive and negative cycles through transistors 130 and 132, respectively.

Switch bank 506 is arranged to receive a voltage from secondary side 504 and to output voltage at node 140. Switch bank 506 is also arranged to receive selector signal 208. Selector 206 is arranged to receive an instruction signal 210 and to generate selector signal 208. In this example embodiment, selector signal 208 is illustrated as a plurality of bits Sw0-SwN. Output filter 204 is arranged to receive the output voltage from node 140 and to output a filtered voltage 212.

Switch bank 506 provides output voltage at node 140 from base voltage capacitor 134 or one of connection nodes of capacitors 134, 540, 536, 128, 126, 534 and 538. Capacitors 540, 536, 128, 126, 534 and 538 are connected in series to provide multiple voltage steps. Baseline voltage capacitor 134 can be connected to switch bank 506 output at node 140 when transistor 218 is turned on. When one of any other switches, such as switch 544, is turned on, the voltages stored on stacked up capacitors 538 and 534 are added to the voltage stored on capacitor 134. The output voltage at node 140 is equal to the voltage combination of the voltages stored in capacitors 538, 534 and 134, for this case. The output voltage at node 140 will be changed based on which switch of the switch bank is turned on.

On primary side 502, DC input 136 is connected to a resonant converter, such as LLC converter. As an example embodiment, the LLC converter includes two MOSFETs, transistor 508 and transistor 510, each generating squared voltage pulses out of phase with each other. Capacitor 512 and capacitor 514 resonate with inductor 516 and inductor 518 creating an AC current. The AC current creates a soft-switching condition for transistors 508 and 510 to achieve Zero Voltage Switching (ZVS). ZVS is a technique in which the power switch in a converter turns on/off when there is a zero voltage across it. ZVS minimizes switching transient noise output from the converter and improve power conversion efficiency.

Inductor 518 is arranged in parallel with primary winding 108. As result of the AC current flowing through it, primary winding 108 creates an electromotive force generating a magnetic field whose intensity is modulated by switch driver signal 138. Controller 105 provides switch driver signal 138, which is routed to transistor 508 and transistor 510. Controller 105 provides signal 148 to secondary side 504 and drive transistors 530, 526, 122, 124, 528, 532, 130 and 132 after the signal is isolated and amplified, as shown in FIG. 5.

Current transformer 110 is connected in series to primary winding 108. Current transformer 110 detects the AC current crossing over zero and then generates signals having sufficient amplitude to control and drive the transistors in transistor-capacitor bank 524 and transistors 130 and 132. The power transformer should be built to have much higher magnetizing inductance, compared with inductor 518. In such a way, the AC current and the currents of secondary windings will have the same phase, and current transformer current sensing signal can be used as a synchronous signal to drive secondary transistors.

Transistors of the transistor-capacitor bank act as rectifiers themselves when the transistors are not turned on. When turned on, the transistors can conduct current bi-directly. A MOSFET is often used for such applications, but other alternatives are also possible. Transistors 530, 526, 122 and 130 are turned on at a positive cycle, when induced voltages of secondary windings are positive. Transistors 124, 528, 532 and 132 are turned on at a negative cycle, when induced voltages of secondary windings are negative. Activating/deactivating the transistors with a proper timing will reduce power loss and provide a current for output capacitor charging or discharging.

Transistors 530, 526, 122, 124, 528, 532, 130 and 132 are controlled by a current signal coming from current transformer 110 on primary side 502. Current transformer 110 detects the current passing through primary winding 108. Induced voltages on secondary side 504 are in phase of the detected current. Thus, the signal of current transformer 110 can be used for secondary rectifier transistor control after the signal is amplified and isolated by driving circuitry 156 as shown in FIG. 1B. Controller 105 can also generate signal 148 for the same purpose after it is amplified and isolated by a driver circuit, similar to that shown in FIG. 1B. In this example, the driver circuit would include additional secondary windings for each of transistors 530, 526, 528 and 532.

Switch bank 506 routes a voltage to output filter 204. Switch bank 506 receives selector signal 208 that determines the routing of the voltage to a plurality of switch pairs. In this example embodiment, seven switch pairs will be discussed for illustrations purposes but a lesser or greater number of switch pairs can be used.

Switch pairs 542, 544, 214, 216, 548 and 550 serve as bidirectional switches allowing routing of any capacitor's voltage of transistor-capacitor pair bank 524 to output filter 204. Transistor 218 serves as a one-way switch routing output signal to output voltage at node 140 while bypassing transistor-capacitor pair bank 524.

Selector 206 outputs selector signal 208 based on instruction signal 210. Switch pairs 542, 544, 214, 216, 548 and 550 and transistor 218 may be activated based on selector signal 208. In an example embodiment, instruction signal 210 may be encoded as three-bit binary value. In this example, for purposes of discussion, presume that: a binary value 000 in selector signal 208 will turn on transistor 218, on but will turn off switch pair 542, switch pair 544, switch pair 214, switch pair 216, switch pair 548 and switch pair 550; a binary value 001 in selector signal 208 will turn switch pair 542, on but will turn off switch pair 542, switch pair 214, switch pair 216, switch pair 548, switch pair 550 and transistor 218; a binary value 010 in selector signal 208 will turn switch pair 544 on but will turn off switch pair 542, switch pair 214, switch pair 216, switch pair 548, switch pair 550 and transistor 218; a binary value 011 in selector signal 208 will turn switch pair 214 on but will turn off switch pair 542, switch pair 544, switch pair 216, switch pair 548, switch pair 550 and transistor 218; a binary value 100 in selector signal 208 will turn switch pair 216 on but will turn off switch pair 542, switch pair 544, switch pair 214, switch pair 548, switch pair 550 and transistor 218; a binary value 101 in selector signal 208 will turn switch pair 548 on but will turn off switch pair 542, switch pair 544, switch pair 214, switch pair 216, switch pair 550 and transistor 218; a binary value 110 in selector signal 208 will turn switch pair 550, on but will turn off switch pair 542, switch pair 544, switch pair 214, switch pair 216, switch pair 548 and transistor 218.

Further, selector signal 208 is always arranged to turn on only one switch at any given time allowing for voltages to flow through it. In this example, therefore: a binary value 000 in selector signal 208 will turn transistor 218 on, allowing baseline voltage at node 154 to be output to node 140 but prevent all other switch pairs, from conducting a charge stored on any of their capacitors; a binary value 001 in selector signal 208 will turn switch pair 542 on, allowing a combination of the voltage stored on capacitor 538 and the baseline voltage at node 154 to be output to node 140, but prevent all other switch pairs from conducting voltages stored on any of their capacitors; a binary value 001 in selector signal 208 will turn switch pair 544 on, allowing a combination of the voltages stored on capacitor 538 and capacitor 534 and baseline voltage at node 154 to be output to node 140. Similarly the output baseline voltage at node 154 is routed through switch pairs 214, 216 and 548 as they are turned on and added to their respective capacitors allowing each time for an increasingly stepped voltage to node 140. Finally a binary value 110 in selector signal 208 will turn switch pair 550 on, allowing a combination of the baseline voltage at node 154, and the voltages of capacitor 540, capacitor 536, capacitor 128, capacitor 126, capacitor 534, and capacitor 538 to then flow to node 140.

In this example embodiment, each switch pair 542, 544, 214, 216, 548 and 550, includes two MOSFETs configured as a bidirectional switch. However, any known switching mechanism may be used.

A baseline voltage at node 154 is generated by having induced current 152 flow through secondary winding 116, and transistor 130 and transistor 132. The baseline voltage at node 154 is regulated by a closed feedback loop. The feedback loop, implemented with controller 105, senses feedback signal 146 and creates modulated primary switch driver signal 138 to control primary power stage and secondary gate driver signal 148, to control the rectifier transistors.

Close loop control ensures that the baseline voltage at node 154 stays within a desired range. Capacitor 134 outputs the baseline voltage, and is discharged as long as a load is applied to output 212. The other capacitors, if selected by selector 206 to add their voltages and provide power to the output, also discharge their charge when a load is applied to output 204. However, the capacitors not selected by selector 206 may continue to receive charge without releasing any charge to the load. This could cause a voltage rising at these non-selected capacitors and result in voltage unbalance in secondary side 504. The unique configuration in accordance with the present invention has charge/voltage balancing capability and prevents such a voltage unbalance. The principle of voltage balancing will now be described.

Due to magnetic coupling among all windings, all capacitors of transistor-capacitor pair bank 524 should have voltages based on a corresponding winding's turn ratio. If secondary windings 520, 522 and 114 have the same number of turns, and the turn ratio between the windings and secondary winding 116 is 1:N, for ideal case, capacitors 538, 534, 126, 128, 536 and 540 should have a same voltage, the value of the baseline voltage at node 154 divided by N. Since the baseline voltage at node 154 is regulated and basically remains constant, the voltages on all capacitor within transistor-capacitor pair bank 524 also stays constant. In reality, any winding has some leakage and magnetic coupling is not perfect. Such factors can contribute to a certain level of unbalance of the capacitor voltage. However, a circuit in accordance with the present invention prevents any significant voltage unbalancing.

Since winding 522 has the same turn number of secondary windings 520 and 114, all the windings will have a same induced voltage generated by the same magnetic field in the power transformer core. During positive primary AC cycle, transistors 530, 526, 122 and 130 are turned on. Assuming the induced voltage at secondary windings 520 and 114 is $V_w$ and Voltage of capacitor 534>$V_w$>Voltage of capacitors 538 and 126, this induced voltage $V_w$ will produce positive currents passing transistors 530 and 122 to charge capacitors 538 and 126 respectively, but it will produce a negative current passing transistor 526 to discharge capacitor 534. The same magnetic field mentioned above will also induce $N*V_w$ voltage and a positive current passing transistor 130 to charge capacitor 134. This process will force all capacitors 538, 534, 126 and 134 to balance their voltages based on turn ratio in positive AC cycles. A similar process will force all capacitors 128, 536, 540 and 134 to balance their voltages during negative AC cycles. Capacitor 134 actually helps to balance the voltages between capacitors 538, 534 and 126 charged in positive AC cycles and capacitors 128, 536 and 540 charged in negative cycles.

Small voltage unbalance may still exist because of winding leakage and imperfect magnetic coupling among the windings. Smaller leakage and better magnetic coupling will result in a better voltage balance. Similar to the discussion above with reference to FIG. 2, if multiple voltage doublers are included, a baseline capacitor may be used to balance the charges in the positive cycle with the charges in the negative cycle. This will now be described in greater detail.

Capacitor 134 enables a precise charge to be equally stored on capacitors 126, 534 and 538 in the positive cycle and on capacitors 128, 536 and 540 in the negative cycle. For example, for purposes of explanation, presume that during a positive cycle, capacitors 126, 534 and 538 are supposed to store 3.3 V and during a negative cycle, capacitors 128, 536 and 540 are additionally supposed to store 3.3 V. However, presume that during a positive cycle, capacitors 126, 534 and 538 actually store 4.0 V, whereas capacitors 128, 536 and 540 store 3.3 V. In this situation, the extra 0.7 V stored on capacitors 126, 534 and 538 will be discharged to capacitor 134 by way of the coupling between secondary winding 114 and secondary winding 116.

An increased 2.1 V will be provided on capacitor 134 based on the turn ratio of secondary winding 116 and secondary windings 114, 520, 522, which is 3:1. This increased 2.1 V will be reflected in feedback signal 146, which will be reflected in switch driver signal 138. Switch driver signal 138 will therefore instruct primary side 502 to increase the frequency of the current through primary winding 108, to decrease the induced magnetic field through secondary winding 114. The decreased magnetic field through secondary windings 114, 520, 522 will decrease the induced current through secondary transistors 122, 526, 530, 124, 528 and 532. The decreased current through secondary transistors 122, 526, 530, 124, 528 and 532 will decrease the charge on capacitors 126, 534 and 538 (in the positive cycle) and capacitors 128, 536 and 540 (in the negative cycle).

In this example, capacitors 126, 534 and 538 will now store the expected 3.3 V as a result of the decreased current. Accordingly, the previous increase of 0.7 V for each capacitor has been eliminated. However, capacitors 128, 536 and 540 will now store 2.6 V as a result of the decreased current. Capacitors 128, 536 and 540 had stored the correct voltage of 3.3 V before the current was reduced. Nevertheless, the additional 2.1 V residing on capacitor 134 (that had been transferred from capacitors 126, 534 and 538) will now discharged to capacitors 128, 536 and 540 by way of the coupling between secondary windings 114, 520, 522, and secondary winding 116.

In other words, if there is an excess of charge on capacitors in one cycle, the excess charge will be temporarily transferred to capacitor 134. After the driving current is reduced, to account for the excess of charge on the capacitors, then the charge on all the capacitors is reduced. At that point, the excess charge that was temporarily transferred to capacitor 134 will then be transferred to the other capacitors. Accordingly, a precise charge is maintained on all capacitors.

The feedback mechanism discussed above will additionally address situations where insufficient charge is stored on a capacitor in a manner similar to that discussed above with reference to FIG. 2. In other words, if there is an insufficient charge on one of the group of capacitors 128, 536 and 540 and the group of capacitors 126, 534 and 538, then capacitor 134 will temporarily provide the required charge. After the driving current is increased, to account for the decrease of charge on the group of capacitors, then the charge on the group of capacitors 128, 536 and 540 and the group of capacitors 126, 534 and 538 is increased. At that point, the excess charge on the other of the group of capacitors 128, 536 and 540 and the group of capacitors 126, 534 and 538 will be returned to capacitor 134. Accordingly, a precise charge is maintained on both groups of capacitors.

It is very difficult for conventional power supply circuits to provide precisely-stepped voltages. In accordance with an aspect of the present invention, a power supply circuit may easily provide precisely-stepped voltages. Another difficulty is control all switches of switch bank with a simple and low cost mechanism. For example, as discussed above with reference to power supply 500, a stepped output is precisely and rapidly provided by way of five novel features, as will be summarized below.

In a first feature, by providing an equal number of turns in secondary winding 114, secondary winding 520 and secondary winding 522, equal voltages will be provided to capacitors 124, 538 and 534, respectively, during a positive cycle. Accordingly, with a single winding, i.e., the combination of secondary winding 520 and secondary winding 522, a plurality of precisely equal voltages may be generated. Similarly, with an equal number of turns in secondary winding 114, secondary winding 520 and secondary winding 522, equal voltages will be provided to capacitors 128, 540 and 536, respectively, during a negative cycle. Secondary winding 116 is a center-tapped secondary winding. It generates a same voltage to be provided to capacitor 134 during both position and negative cycles. The voltage relationship among the capacitors is dependent on the corresponding winding turn ratios. Capacitor 134 bridges capacitor voltage balancing between positive cycles and negative cycles and leads to voltage balance for all capacitors.

In a second feature, a closed-loop feedback mechanism including baseline voltage rectification output that includes secondary winding 116, transistor 130, transistor 132 and capacitor 134. Controller 105 and primary AC current generator 502 maintains constant voltage for each output capacitor, and maintains equal charges stored in the capacitors of transistor-capacitor pair bank 524.

The aspect of the present invention described above with reference to FIGS. 2-5 provides the benefit of generating, with a single power stage, a plurality of precise voltages from well coupled windings. The voltage precision achieved because a feedback control is closed and because there are a plurality of voltages generated from well coupled windings. Therefore, with a single power supply and multiple output voltages, a power supply in accordance with the present invention may switch from one voltage to the other, or add one voltage on top of the other, to efficiently produce a rapid change of its output voltage.

In a third feature, the proposed circuit includes a bidirectional switch bank to switch envelope tracking (ET) output power supply voltages from one value to the other at a very rapid rate and with very high efficiency. The switch configuration provides a simple common-ground driver circuit to drive all switches.

In a fourth feature, the voltage applied to output filter 204 is a step voltage. The rising or falling rate of the voltage can be as fast as a switch's switching speed. It allows this ET to track a very fast envelope signal.

In a fifth feature, resonant converters, such as LLC converter, is able to allow any output of the transistor-capacitor pair bank to sink and source current. The current sinking capability dramatically increases the falling rate of the output voltage at node 212. Extra energy at output capacitor 230 of filter 204 can be charged back to other capacitors of the LLC converter's secondary when the voltage at node 212 needs to be decreased rapidly. Besides the energy recycling, the LLC can achieve soft switching (ZVS) and minimize switching loss over a wide load range. Overall, an ET power supply in accordance with the present invention is able to achieve a very high efficiency.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

The invention claimed is:

1. A transmission device comprising:
   a signal source operable to generate a command signal and a source signal;
   a voltage supply circuit including an alternating current generating portion and a full rectifying portion, said voltage supply circuit being operable to generate an envelope tracking voltage based on the command signal;
   a transmitting portion operable to transmit a signal based on the source signal and the envelope tracking voltage;
   wherein said alternating current generating portion is to receive the command signal and includes a first input transistor, a second input transistor and a primary winding, wherein said first input transistor and said second input transistor are operable to generate a primary alternating current through said primary winding based on the command signal;
   wherein said full rectifying portion includes a multiple tapped secondary winding and a voltage doubler having a first transistor, a second transistor, a first capacitor and a second capacitor, wherein said multiple tapped secondary winding is operable to generate a secondary alternating current based on the primary alternating current, wherein said first transistor is operable to conduct a first current in a first direction to the first capacitor based on a positive portion of the secondary alternating current, wherein said first capacitor is operable to store a first charge based on the first current, wherein said second transistor is operable to conduct a second current in a second direction to said second capacitor based on a negative portion of the secondary alternating current, and wherein said second capacitor is operable to store a second charge based on the second current;
   wherein said voltage supply circuit further comprises a baseline voltage generating portion operable to generate a baseline voltage and including a second secondary winding and a full-wave rectification circuit having a first rectifier transistor, a second rectifier transistor and a baseline capacitor, wherein said second secondary winding is operable to generate a baseline alternating current based on the primary alternating current, wherein said first rectifier transistor is operable to conduct a first baseline current in the first direction charging said baseline capacitor based on a positive portion of the baseline alternating current, wherein said second rectifier transistor is operable to conduct a second baseline current in the second direction charging said baseline capacitor based on a negative portion of the baseline alternating current, wherein said baseline capacitor is operable to store a baseline charge based on the first baseline current and the second baseline current, and wherein a baseline voltage is generated in the baseline capacitor;
   wherein said baseline capacitor is coupled to the first and second capacitors to charge during both positive and negative directions for voltage balancing the first and second capacitors, wherein said first capacitor, said second capacitor, said third baseline capacitor are connected in series to form a capacitor string and to provide a stepped output voltage;
   further comprising a switch bank including a plurality of bidirectional switches, wherein said switch bank is operable to generate an output based on a voltage of said first capacitor, a voltage of said second capacitor, a voltage of said baseline capacitor, or a combination thereof, the bidirectional switches allowing current to flow back to the voltage supply circuit when voltage at the output is to be reduced, and wherein said plurality of bidirectional switches are connected to have a common ground.

2. The transmission device of claim 1, wherein said voltage supply circuit further comprises a LLC converter including a first inductor, a second inductor and a capacitor, said LLC converter being operable to generate an AC current with zero-voltage switching, wherein said first input transistor and said second input transistor are operable to generate the primary alternating current through said primary winding with zero-voltage switching.

3. The transmission device of claim 1, wherein said voltage supply circuit further comprises an output filter arranged to receive the output of said switch bank, said output filter including an output capacitor, an output inductor and a damping network.

4. The transmission device of claim 1, wherein said voltage supply circuit further comprises a selector operable to output gate driver signal to turn on one of said plurality of bidirectional switches to generate the output of said switch bank.

5. The transmission device of claim 1, wherein said alternating current generating portion is operable to modify the primary alternating current through said primary winding based on the excess charge on said baseline capacitor.

6. The transmission device of claim 5, wherein, when said baseline capacitor has received an excess charge from one of said first capacitor and said second capacitor, the other of said first capacitor and said second capacitor is arranged to receive the excess charge from said baseline capacitor by way of the coupling of said multiple tapped secondary winding and said second secondary winding, wherein the second secondary winding is a center-tapped secondary winding.

7. The transmission device of claim 1, wherein said voltage supply circuit further comprises a controller operable to provide first gate driver signals, based on the baseline voltage, to said first input transistor and said second input transistor to regulate the baseline voltage and to provide second gate driver signals to said first transistor and said second transistor to control the first current and the second current to achieve synchronized rectification.

8. The transmission device of claim 7, wherein said controller comprises a first gate driver circuit operable to provide the first gate driver signals and a second gate driver circuit operable to provide the second gate driver signals.

9. The transmission device of claim 1,
   wherein said multiple tapped secondary winding has a positive integer n turns;
   wherein said full rectifying portion further includes M voltage doublers, wherein M is a positive integer greater than 1;
   wherein each M voltage doubler includes a respective first transistor, a respective second transistor, a respective first capacitor and a respective second capacitor;
   wherein each M voltage doubler is connected to said multiple tapped secondary winding such that there are an equal number of turns of said multiple tapped secondary winding for each portion thereof for said voltage doubler and for each of said M voltage doublers, and wherein said multiple tapped secondary winding is further operable to generate equal secondary alternating currents based on the primary alternating current for each of said M voltage doublers, respectively; and wherein each said respective first transistor is operable to conduct an equal first respective current in a first respective direction to each said respective first capacitor based on the positive portion of the secondary alternating current, wherein each said respective first capacitor is operable to store an equal first respective charge based on the respective first currents, wherein each said respective second transistor is operable to conduct an equal second respective current in a second respective direction to each said respective second capacitor based on the negative portion of the secondary alternating current, wherein each said respective second capacitor is operable to store an equal respective second charge based on the respective second currents.

10. A method of generating multiple output voltages, said method comprising:

receiving, via an alternating current generating portion having a power transformer that includes a primary winding, an input voltage;

generating a primary alternating current through the primary winding of the power transformer;

generating, via a first portion of a multiple tapped secondary winding, a secondary alternating current based on the primary alternating current;

providing, via a rectification circuit, a positive portion of the secondary alternating current across a first output capacitor to generate a first output voltage;

providing, via the rectification circuit, a negative portion of the secondary alternating current across a second output capacitor to generate a second output voltage;

modulating, via a feedback circuit, the primary alternating current based on at least one of the first output voltage and the second output voltage;

wherein the rectification circuit, the first output capacitor and the second output capacitor are arranged such that the rectification circuit is operable to conduct current bi-directionally to sink the positive portion of the secondary alternating current to the first output capacitor, to source the positive portion of the secondary alternating current to the first output capacitor, to sink the negative portion of the secondary alternating current to the second output capacitor, to source the negative portion of the secondary alternating current to the second output capacitor;

further comprising providing the rectification circuit having a baseline voltage generating portion operable to generate a baseline voltage and including a second secondary winding and a full-wave rectification circuit having a first rectifier transistor, a second rectifier transistor and a baseline capacitor, wherein the second secondary winding is operable to generate a baseline alternating current based on the primary alternating current, and wherein a baseline voltage is generated in the baseline capacitor;

wherein the first output capacitor, the second output capacitor, and the baseline capacitor are connected in series to form a capacitor string and to provide a stepped output voltage;

wherein when an excess charge is stored on one of the first output capacitor and the second output capacitor, the baseline capacitor is arranged to receive the excess charge by way of a coupling between the multiple tapped secondary winding and the second secondary winding, wherein the baseline capacitor charges during positive and negative cycles for voltage balancing the first and second output capacitors.

11. The method of claim 10, further comprising modifying, via the alternating current generating portion, the primary alternating current through the primary winding based on the excess charge on the baseline capacitor.

12. The method of claim 11, wherein when the baseline capacitor has received an excess charge from one of the first output capacitor and the second output capacitor, the other of the first output capacitor and the second output capacitor is arranged to receive the excess charge from the third baseline capacitor by way of the coupling of the multiple tapped secondary winding and the second secondary winding, wherein the second secondary winding is a center-tapped secondary winding.

13. A method of generating a tracking voltage based on an input signal, said method comprising:

providing a voltage supply circuit comprising an alternating current generating portion, and a full rectifying portion, the alternating current generating portion being operable to receive an input voltage and including a first input transistor, a second input transistor and a primary winding, the first input transistor and the second input transistor being operable to generate a primary alternating current through the primary winding based on the input voltage, and the full rectifying portion including a first portion of a secondary winding and a voltage doubler having a first transistor, a second transistor, a first capacitor and a second capacitor, the first portion of the secondary winding being operable to generate a secondary alternating current based on the primary alternating current, the first transistor being operable to conduct a first current in a first direction charging the first capacitor based on a positive portion of the secondary alternating current, the first capacitor being operable to store a first charge based on the first current, the second transistor being operable to conduct a second current in a second direction charging the second capacitor based on a negative portion of the secondary alternating current, the second capacitor being operable to store a second charge based on the second current;

receiving, via a selector, the input signal;

generating, via the selector, a voltage selection signal;

selecting, via a switch bank, a desired voltage from the voltage supply circuit based on the voltage selection signal;

outputting, via the voltage supply circuit, the desired voltage as an output voltage;

filtering, via an output filter, the output voltage;

providing a baseline voltage generating portion operable to generate a baseline voltage and including a second secondary winding and a full-wave rectification circuit having a first rectifier transistor, a second rectifier transistor and a baseline capacitor, wherein the second secondary winding is operable to generate a baseline alternating current based on the primary alternating current, and wherein a baseline voltage is generated in the baseline capacitor;

further having wherein the first capacitor, the second capacitor, and the baseline capacitor are connected in series to form a capacitor string and to provide a stepped output voltage; and wherein when an excess charge is stored on one of the first output capacitor and the second output capacitor, the baseline capacitor is arranged to receive the excess charge by way of a coupling between the multiple tapped secondary winding and the second secondary winding, wherein the baseline capacitor charges during positive and negative cycles for voltage balancing the first and second capacitors, and wherein said switch bank comprises bidirectional switches allowing current to flow back to the voltage supply circuit when the output voltage is to be reduced.

* * * * *